United States Patent
Bilir et al.

(10) Patent No.: US 9,209,597 B2
(45) Date of Patent: Dec. 8, 2015

(54) METHOD AND DEVICE FOR PRODUCING WHITE LIGHT FROM $Y_2O_3$ NANO-POWDERS

(71) Applicants: Gokhan Bilir, Brighton, MA (US); Baldassare Di Bartolo, Medford, MA (US)

(72) Inventors: Gokhan Bilir, Brighton, MA (US); Baldassare Di Bartolo, Medford, MA (US)

(*) Notice: Subject to any disclaimer, the term of this patent is extended or adjusted under 35 U.S.C. 154(b) by 0 days.

(21) Appl. No.: 14/298,602

(22) Filed: Jun. 6, 2014

(65) Prior Publication Data
US 2014/0362884 A1    Dec. 11, 2014

Related U.S. Application Data

(60) Provisional application No. 61/831,925, filed on Jun. 6, 2013.

(51) Int. Cl.
| | |
|---|---|
| *F21V 9/16* | (2006.01) |
| *H01S 5/00* | (2006.01) |
| *F21K 99/00* | (2010.01) |
| *C09K 11/77* | (2006.01) |
| *C01F 17/00* | (2006.01) |

(52) U.S. Cl.
CPC ............ *H01S 5/005* (2013.01); *C01F 17/0043* (2013.01); *C09K 11/7701* (2013.01); *F21K 9/56* (2013.01); *C01P 2002/72* (2013.01); *C01P 2004/03* (2013.01); *C01P 2004/64* (2013.01)

(58) Field of Classification Search
CPC ....... F21K 9/56; F21V 9/16; F21Y 2101/025; C01F 17/0043; C09K 11/7703; H01S 5/005
USPC .............................................. 362/84, 259, 553
See application file for complete search history.

(56) References Cited

U.S. PATENT DOCUMENTS

| | | | |
|---|---|---|---|
| 8,994,259 B2 * | 3/2015 | Tamaki et al. ................ 313/483 |
| 2002/0051740 A1 * | 5/2002 | Konrad et al. ................ 422/188 |
| 2010/0202129 A1 * | 8/2010 | Abu-Ageel ..................... 362/84 |
| 2012/0195021 A1 * | 8/2012 | Achtenhagen et al. ......... 362/84 |
| 2013/0043406 A1 * | 2/2013 | Huignard et al. .......... 250/459.1 |
| 2014/0003074 A1 | 1/2014 | Kishimoto |
| 2014/0126178 A1 | 5/2014 | Kishimoto |

(Continued)

FOREIGN PATENT DOCUMENTS

GB        1506334      * 10/1976     .......... C09K 11/02

OTHER PUBLICATIONS

Bilir et al, Laser diode induced white light emission of γ-Al2O3 nano-powders, Journal of Luminescence153(2014) 350-355, Apr. 1, 2014.

(Continued)

*Primary Examiner* — Peggy Neils
(74) *Attorney, Agent, or Firm* — AKC Patents LLC; Aliki K. Collins

(57) ABSTRACT

A device for producing white light includes a light conversion module and a light source. The light conversion module includes undoped metal oxide powder comprising particles having a size of less than 50 nm. The light source generates excitation light having a wavelength in the near infrared region. The excitation light is directed towards the undoped metal oxide powder, the undoped metal oxide powder is excited with the excitation light, and the excited undoped metal oxide powder emits white light having a continuous spectral distribution in the range of 440 nm to 900 nm.

22 Claims, 7 Drawing Sheets

(56) References Cited

U.S. PATENT DOCUMENTS

2014/0146530 A1    5/2014    Guiset et al.
2014/0233211 A1*    8/2014    Chen et al. ................... 362/84
2014/0353702 A1*   12/2014   Nagao et al. .................. 257/98
2014/0362600 A1*   12/2014   Suckling et al. ............. 362/583
2015/0092391 A1*    4/2015    Eberhardt et al. ............ 362/84

OTHER PUBLICATIONS

Bilir et al, Production of bright, wideband white light from $Y_2O_3$ nano-powders induced by laser diode emission, Optical Materials 36 (2014) 1357-1360 , Apr. 6, 2014.

\* cited by examiner

METHOD AND DEVICE FOR PRODUCING WHITE LIGHT FROM $Y_2O_3$ NANO-POWDERS

CROSS REFERENCE TO RELATED CO-PENDING APPLICATIONS

This application claims the benefit of U.S. provisional application Ser. No. 61/831,925 filed on Jun. 6, 2013 and entitled Production of Bright, Wideband White Light from $Y_2O_3$ Nano-powders Induced by Laser Diode Emission, the contents of which are expressly incorporated herein by reference.

FIELD OF THE INVENTION

The present invention relates to a method and a device for producing white light from $Y_2O_3$ nano-powders.

BACKGROUND OF THE INVENTION

The production of white light has challenged physicists and engineers for a long time and continues to do so. Lanthanide ions have attracted the interest of researchers for their ability to up-convert infrared light to the visible. Attention has gone to binary and ternary lanthanides doped materials such as glasses, bulk crystals and nano-powders. Some studies have shown that certain ultra-small semiconductor nano-crystals can emit white light when doped with certain ions. White light has also been obtained by mixing the emissions of light emitting diodes (LEDs) that emit three primary colors (red, green, blue) and by using some phosphor based LEDs.

It would be desirable to provide an inexpensive method and device for producing white light from commercially available oxides without doping, with improved efficiency and light characteristics similar to incandescent lights

SUMMARY OF THE INVENTION

The present invention describes a method and a device for producing white light from $Y_2O_3$ nano-powders.

In general, one aspect of the invention provides a method for producing white light including the following. First, providing a light conversion module comprising undoped metal oxide powder comprising particles having a size of less than 50 nm. Next, providing a light source configured to generate excitation light having a wavelength in the near infrared (NIR) region. Next, directing the excitation light towards the undoped metal oxide powder, exciting the undoped metal oxide powder with the excitation light, and thereby causing the undoped metal oxide powder to emit white light having a continuous spectral distribution in the range of 440 nm to 900 nm.

Implementations of this aspect of the invention include the following. The undoped metal oxide powder comprises $Y_2O_3$. The light source is a laser diode and is configured to generate excitation light having a wavelength of 803.5 nm. The light conversion module further includes a sealed container configured to encase the undoped metal oxide powder and the sealed container comprises a pressure of less than 8 mbars. The emitted white light has International Commission on Illumination (CIE) color coordinates of x=0.45 and y=0.40. The emitted white light has a correlated color temperature (CCT) value in the range of 2700K to 3300K and color rendering index (CRI) in the range of 90 to 100. The emitted white light has a correlated color temperature (CCT) value of 2756K and color rendering index (CRI) of 99. The emitted white light intensity depends exponentially upon the light source power. The $Y_2O_3$ is synthesized via thermal decomposition of Yttrium-Alginate. The undoped metal oxide powder has a purity of 99.999%. The light source is configured to provide an output power of at least 3 Watts. The method further includes focusing the excitation light onto the undoped metal oxide powder. The light conversion module further includes a substrate comprising a depression and the undoped metal oxide powder is tightly packed and compressed into the depression. The substrate is maintained at a temperature in the range of 30 K-300 K.

In general, in another aspect, the invention provides a device for producing white light including a light conversion module and a light source. The light conversion module includes undoped metal oxide powder comprising particles having a size of less than 50 nm. The light source is configured to generate excitation light having a wavelength in the near infrared (NIR) region. The excitation light is directed towards the undoped metal oxide powder, the undoped metal oxide powder is excited with the excitation light, and the excited undoped metal oxide powder emits white light having a continuous spectral distribution in the range of 440 nm to 900 nm. The device further includes a focusing element for focusing the excitation light onto the undoped metal oxide powder. The light conversion module further includes a substrate comprising a depression and the undoped metal oxide powder is tightly packed and compressed into the depression.

Among the advantages of the invention may be one or more of the following. The invention provides an inexpensive method and device for producing white light. The emitted light is multidirectional, bright, has characteristics similar to incandescent lamps and is about 30% more efficient than incandescent lamps.

BRIEF DESCRIPTION OF THE DRAWINGS

Referring to the figures, wherein like numerals represent like parts throughout the several views.

DETAILED DESCRIPTION OF THE INVENTION

The present invention describes a method and a device for producing white light from $Y_2O_3$ nano-powders.

Figure 7:
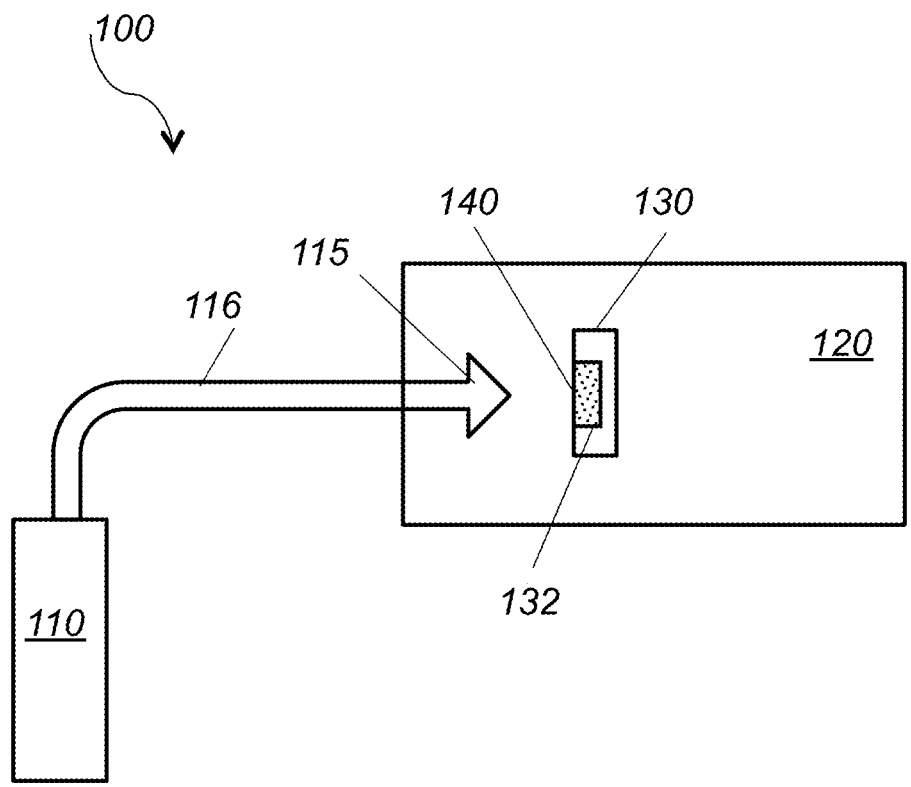
FIG. 7 is a schematic drawing of a device for producing white light from $Y_2O_3$ nano-powders.

Referring to FIG. 7, a device 100 for producing white light from $Y_2O_3$ nano-powders includes a light conversion module 120 and a light source 110. The light conversion module 120 includes undoped metal oxide powder 140 having particles with a size of less than 50 nm. The undoped metal oxide powder is compressed and tightly packed within a depression 132 of a substrate 130. The light source 110 generates excitation light having a wavelength in the near infrared region. In one example, the excitation light source 110 is a laser diode emitting light at 803.5 nm. The excitation light 115 is directed towards the undoped metal oxide powder 140, the undoped metal oxide powder is excited with the excitation light, and the excited undoped metal oxide powder emits white light having a continuous spectral distribution in the range of 440 nm to 900 nm. The excitation light 115 is focused onto the undoped metal oxide powder 140 via a focusing element 116, such as an optical fiber and/or a lens.

EXPERIMENTAL

The materials used in the experiments were nano-sized $Y_2O_3$ samples prepared by the inventors, and other commercially available $Y_2O_3$ nano-samples. Nano-sized $Y_2O_3$ samples were prepared by thermal decomposition of Yttrium-Alginate. This method is based on the thermal decomposition of alginate gels. In this process Yttrium Nitrate Hexahydrate $Y(NO_3)_3 \cdot 6H_2O$ and low viscosity (250 cps of 2% solution) alginic acid sodium salts with analytical grade were used as starting reagents. The reaction that occurs in thermal decomposition process is given in the following equation;

$$4[Y(NO_3)_3 \cdot 6H_2O] \rightarrow 2Y_2O_3 + 6N_2O_5 + 24H_2O \quad (1)$$

X-ray diffraction investigations were carried out with a Bruker AXS D8 Model (Cu-Kα radiation) diffractometer at 40 kV and 30 mA setting in the 2θ range from $20_o$ to $70_o$ with scanning steps of $0.02_o$. A JEOL 6335F model scanning electron microscope was used to get SEM images of the samples.

Commercially available $Y_2O_3$ nano-powders (<50 nm) were also purchased from Sigma Aldrich and used for the production of white light.

The continuous emission spectra of the samples were collected by pumping the samples with the output of a Laser Drive Inc. Model LDI-820 laser diode, which was operated at 803.5 nm. The luminescence signal was directed toward the entrance slit of a 1 m McPherson Model 2051 monochromator and chopped at a frequency of 250 Hz before entering the slit. The monochromator provided a resolution 0.8 Å with the slits set at 50 μm and a wavelength reproducibility of 0.1 Å. The optical signal was detected by Hamamatsu R1387 photomultiplier tube with an S-20 response, sent to an EG&G Model 5210 lock-in amplifier and recorded in a computer.

For the experiments in the temperature range 30-300 K, the samples were mounted on the cold finger (sample holder) of a closed cycle Helium refrigerator. This system uses a Janis Research Model RD dewar connected with a Leybold Model RW2 compressor. The temperature of the sample holder was controlled by using a Lake Shore Cryotonics 331 Model temperature controller. The measurements of continuous luminescence spectra were conducted from 30 to 300 K and in the 440-870 nm wavelength range.

Results of the Structural Characterization

Figure 1:
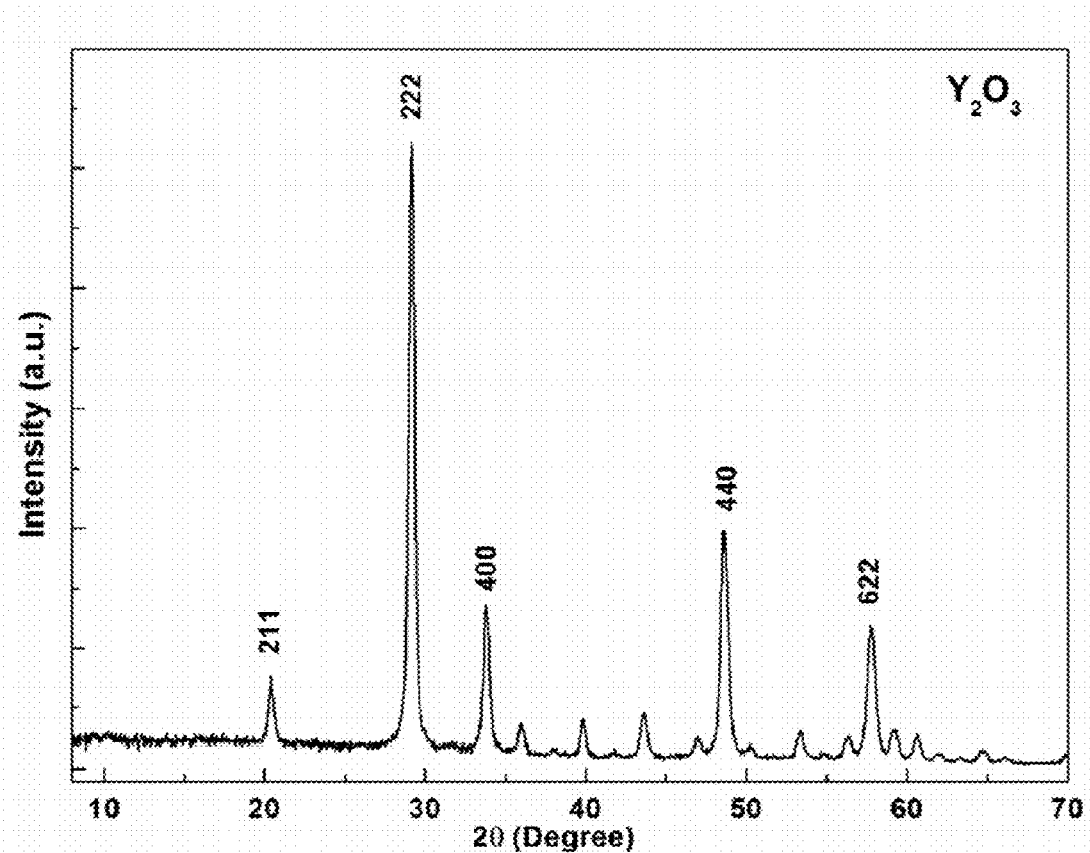
FIG. 1 is a graph of X-ray diffraction (XRD) patterns of samples of an embodiment of the invention.

The cubic phase of the Yttria with the 10.604 Å lattice parameter was determined by using XRD patterns. The particle sizes of the powders were estimated by using the Scherrer Equation reported below;

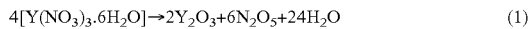

$$L=(K\lambda)/(\beta \cos \theta) \quad (2)$$

where L is the crystallite length, K is a constant that varies with the method of taking the breadth (0.89<K<1), λ is the wavelength of the incident X-ray beam, β is the width of the peak at half maximum intensity of a specific phase (hkl) in radians and θ is center angle of the peak. The (222) peak was used to estimate particle sizes. The XRD results are shown in FIG. 1.

Figure 2:
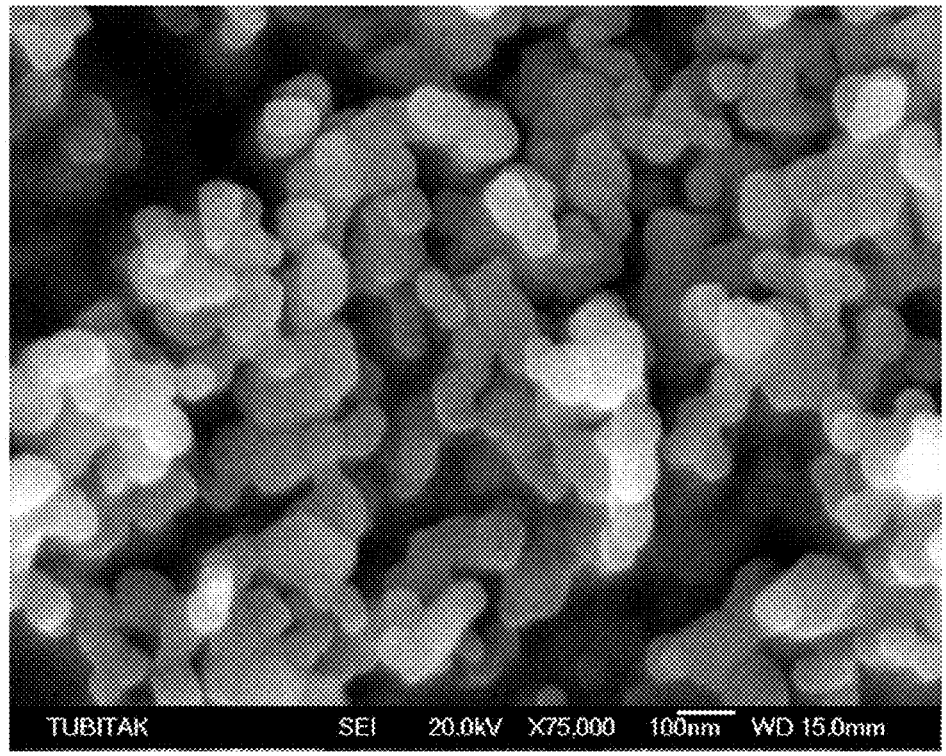
FIG. 2 is a Scanning Electron Microscope (SEM) image of the samples of an embodiment.

The SEM images confirmed the particle sizes estimated by using the Scherrer Equation, as shown in FIG. 2.

The Production of White Light and Results of the Spectroscopic Characterization

The production of white light was achieved by illuminating the $Y_2O_3$ nano-powder sample with the beam of the laser diode operating at 803.5 nm with an output power of 3 Watts. All measurements were performed with the sample's temperature in the region 30 K to 300 K. Since the $Y_2O_3$ nano-powders were synthesized by using the cheap thermal decomposition technique, the cost of the production of white light by using such a method is very small.

Figure 3:
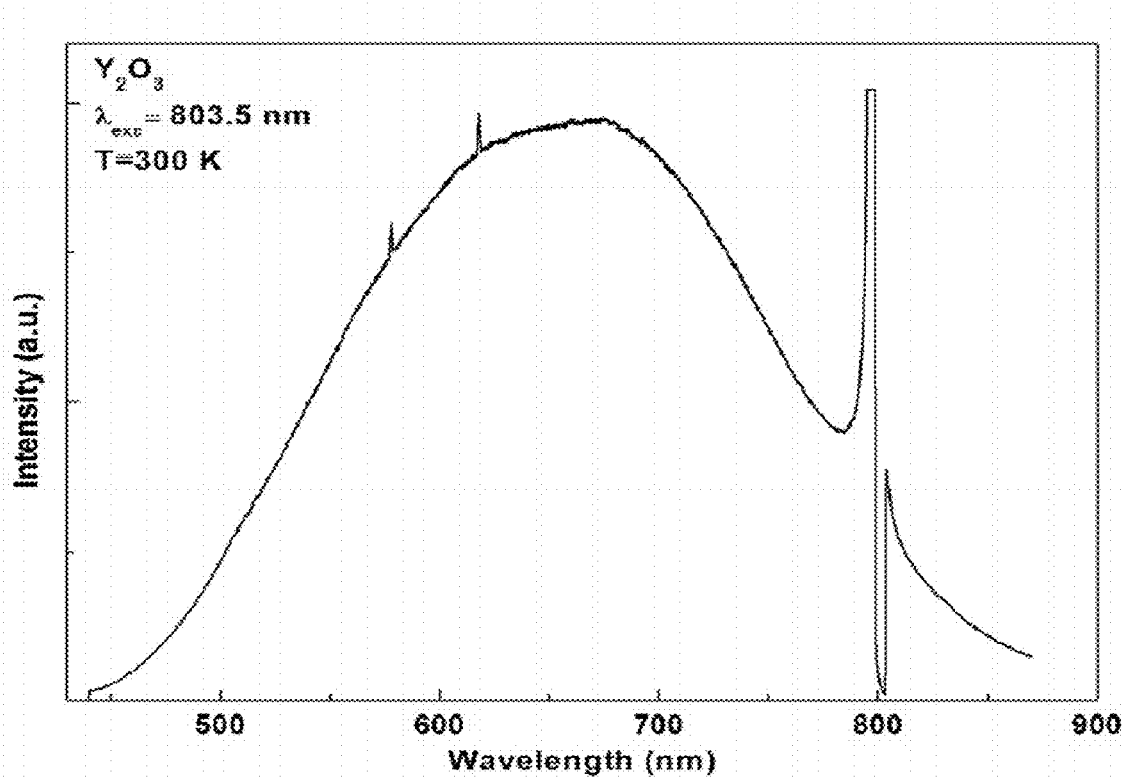
FIG. 3 is a graph of a white light spectrum of an embodiment.

The white light spectrum obtained in our measurements is shown in FIG. 3. The spectrum is smooth and extends from 450 to 900 nm. The big spike present at ~800 nm is due to scattered laser light. The much smaller spikes at ~580 nm and ~620 nm are also due to scattered light from the laser diode that oscillates also at these wavelengths.

The inventors also checked the possible white light emission from commercially available Yttria nano-powders and were able to obtain it from these materials. The inventors didn't notice any dependence of the white light spectrum on the temperature of the sample holder.

Figure 4:
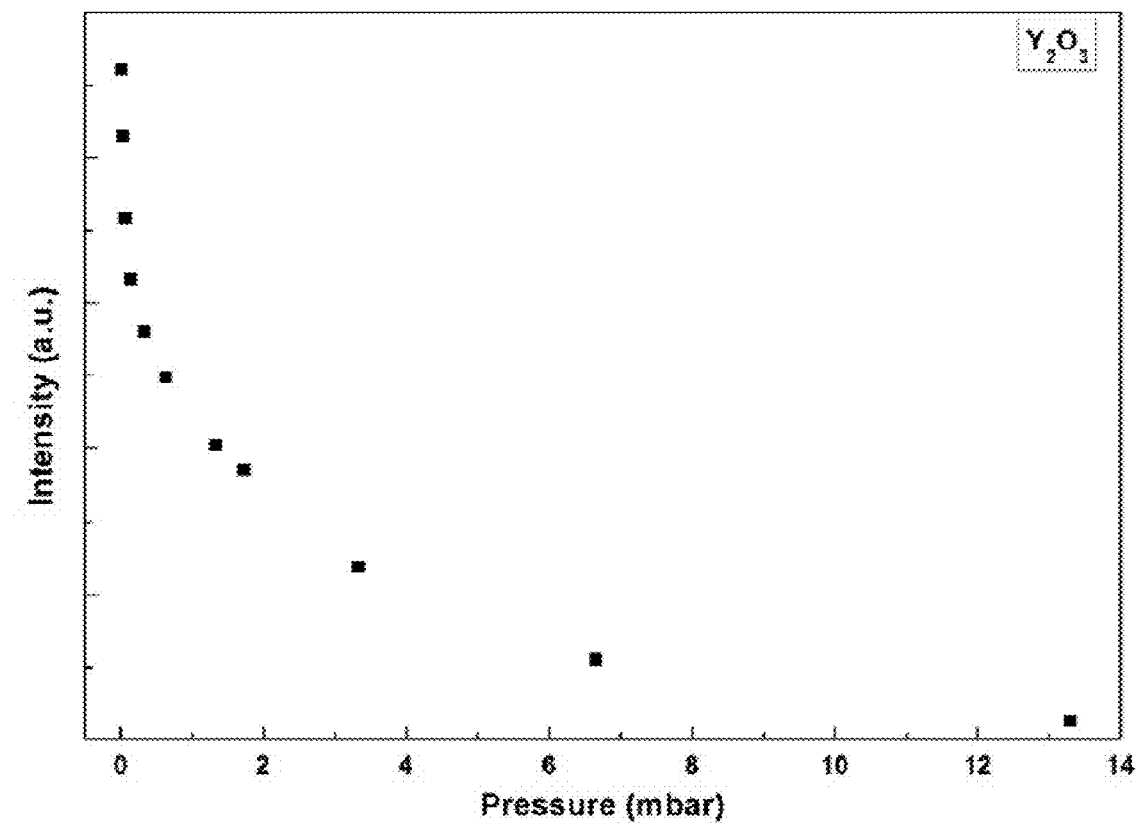
FIG. 4 is a graph of white light intensity dependence on pressure of an embodiment.

All measurements were performed under low pressure because of the strong dependence of the white light on pressure. It was observed that the production of the white light becomes easier under low pressure. The inventors were able to obtain white light under room temperature and atmospheric pressure conditions by using more pumping power than under vacuum. FIG. 4 represents the white light intensity dependence on the pressure and, as it can be seen from this figure, while pressure reduces $10^3$ times, the white light intensity increases 40 times.

The inventors also put some nitrogen and helium into the sample chamber and verified that the type of inert gas in the sample's environment is not responsible for the quenching of light. What quenches the white light is the pressure of the gas in the sample's chamber.

Figure 5:
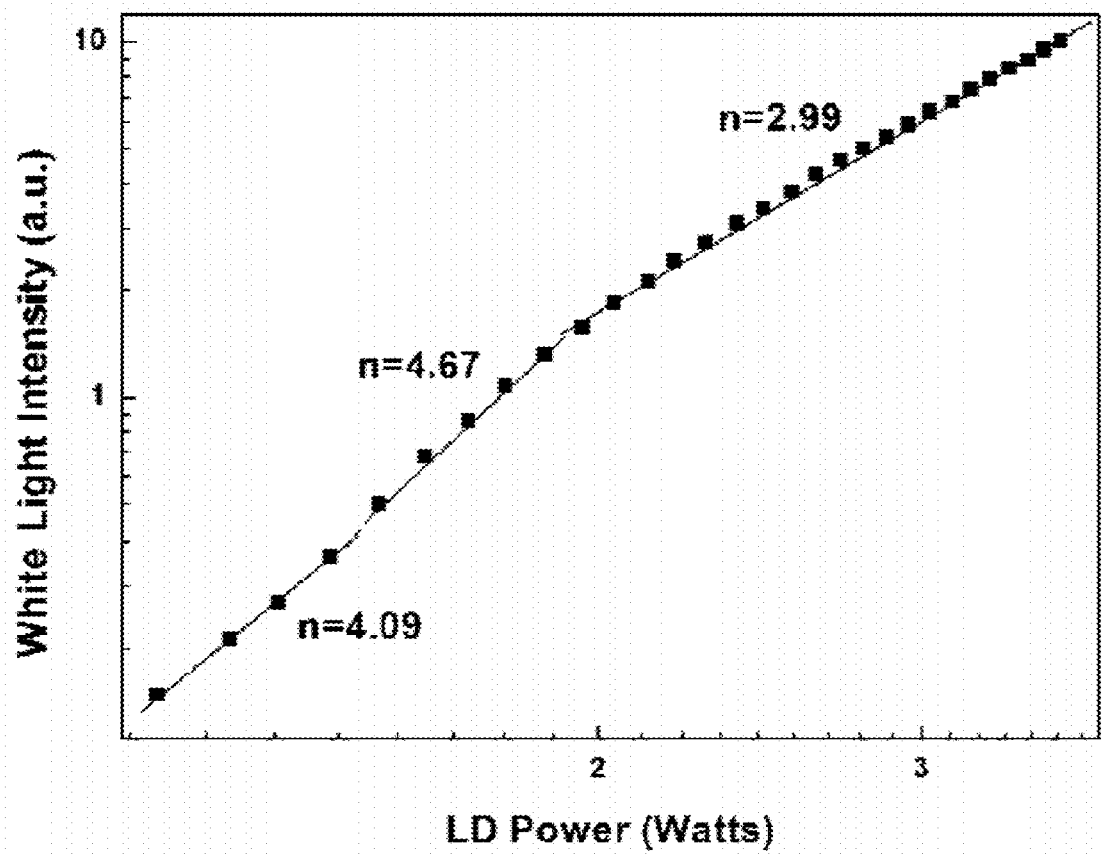
FIG. 5 is a graph of white light intensity variation with pumping power of an embodiment.

As seen from FIG. 5, the inventors observed a notable change of the white light intensity with the varying pumping power. The parameter n presented in the figure represents the experimental dependence of the light intensity on the pumping power.

Figure 6:
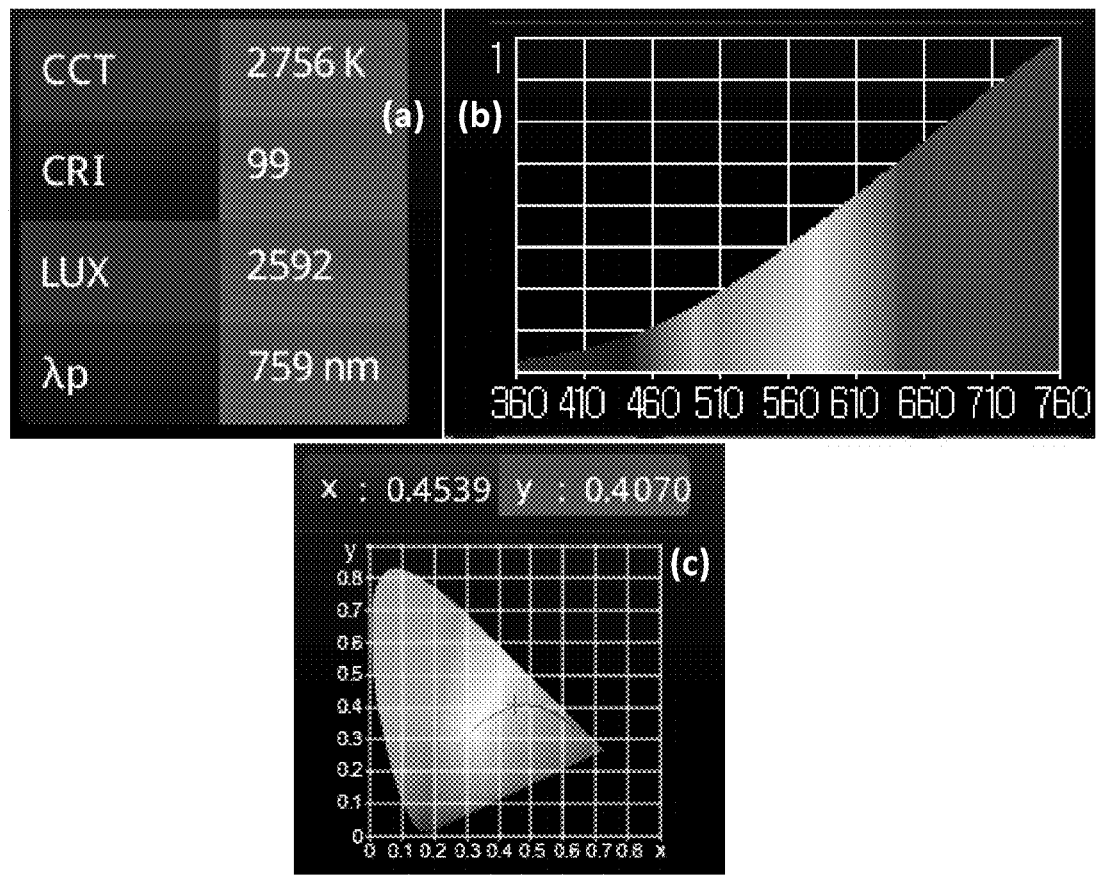
FIG. 6 depicts the CCT, CRI, and illuminance values in (a), the white light spectrum measured using an illuminance meter in (b) and the CIE coordinates of the measured light in (c) for one embodiment.

To measure the "color" of the white light the inventors calculated the CIE (International Commission on Illumination) coordinates and determined them as x=0.50, y=0.44 for focused and x=0.54, y=0.44 for unfocused LD beam. These CIE results are shown in FIG. 6 (c). FIG. 6 also depicts the CCT, CRI, and illuminance values in (a), and the white light spectrum measured using an illuminance meter in (b).

Several embodiments of the present invention have been described. Nevertheless, it will be understood that various modifications may be made without departing from the spirit and scope of the invention. Accordingly, other embodiments are within the scope of the following claims.

What is claimed is:

1. A method for producing white light comprising:
    providing a light conversion module comprising undoped metal oxide powder comprising particles having a size of less than 50 nm;
    providing a light source configured to generate excitation light having a wavelength in the near infrared (NIR) region;
    directing the excitation light towards the undoped metal oxide powder and exciting the undoped metal oxide powder with the excitation light, and thereby causing the undoped metal oxide powder to emit white light having a continuous spectral distribution in the range of 440 nm to 900 nm.

2. The method of claim 1, wherein the undoped metal oxide powder comprises $Y_2O_3$.

3. The method of claim 1, wherein the light source comprises a laser diode configured to generate excitation light having a wavelength of 803.5 nm.

4. The method of claim 1, wherein the light conversion module further comprises a sealed container configured to encase the undoped metal oxide powder and the sealed container comprises a pressure of less than 8 mbars.

5. The method of claim 1, wherein said emitted white light comprises International Commission on Illumination (CIE) color coordinates of x=0.45 and y=0.40.

6. The method of claim 1, wherein said emitted white light comprises a correlated color temperature (CCT) value in the range of 2700K to 3300K.

7. The method of claim 1, wherein said emitted white light comprises color rendering index (CRI) in the range of 90 to 100.

8. The method of claim 1, wherein the emitted white light intensity depends exponentially upon the light source power.

9. The method of claim 2, wherein the $Y_2O_3$ is synthesized via thermal decomposition of Yttrium-Alginate.

10. The method of claim 1, wherein the undoped metal oxide powder comprises a purity of 99.999%.

11. The method of claim 1, wherein the light source is configured to provide an output power of at least 3 Watts.

12. The method of claim 1, further comprising focusing the excitation light onto the undoped metal oxide powder.

13. The method of claim 1, wherein the light conversion module further comprises a substrate comprising a depression and the undoped metal oxide powder is tightly packed and compressed into the depression.

14. The method of claim 13, wherein said substrate's temperature is in the range of 30 K-300 K.

15. A device for producing white light comprising:
a light conversion module comprising undoped metal oxide powder comprising particles having a size of less than 50 nm;
a light source configured to generate excitation light having a wavelength in the near infrared (NIR) region;
wherein the excitation light is directed towards the undoped metal oxide powder, the undoped metal oxide powder is excited with the excitation light, and the excited undoped metal oxide powder emits white light having a continuous spectral distribution in the range of 440 nm to 900 nm.

16. The device of claim 15, wherein the undoped metal oxide powder comprises $Y_2O_3$.

17. The device of claim 15, wherein the light source comprises a laser diode configured to generate excitation light having a wavelength of 803.5 nm.

18. The device of claim 15, wherein the light conversion module further comprises a sealed container configured to encase the undoped metal oxide powder and wherein the sealed container comprises a pressure of less than 8 mbars.

19. The device of claim 15, wherein the emitted white light intensity depends exponentially upon the light source power.

20. The device of claim 15, wherein the undoped metal oxide powder comprises a purity of 99.999%.

21. The device of claim 15, further comprising a focusing element for focusing the excitation light onto the undoped metal oxide powder.

22. The device of claim 15, wherein the light conversion module further comprises a substrate comprising a depression and the undoped metal oxide powder is tightly packed and compressed into the depression.

* * * * *